United States Patent [19]

Payne et al.

[11] Patent Number: 5,341,389
[45] Date of Patent: Aug. 23, 1994

[54] YTTERBIUM- AND NEODYMIUM-DOPED VANADATE LASER HOSE CRYSTALS HAVING THE APATITE CRYSTAL STRUCTURE

[75] Inventors: Stephen A. Payne, Castro Valley; Wayne L. Kway, Fremont; Laura D. DeLoach, Manteca; William F. Krupke, Pleasanton, all of Calif.; Bruce H. T. Chai, Oviedo, Fla.

[73] Assignee: The United States of America as represented by the United States Department of Energy, Washington, D.C.

[21] Appl. No.: 72,951

[22] Filed: Jun. 8, 1993

[51] Int. Cl.$^5$ .................. C09K 11/82; C09K 11/83; C09K 11/85; C09K 11/61
[52] U.S. Cl. .................. 372/41; 252/301.4 R; 252/301.4 H; 252/301.4 F; 252/301.4 P; 372/68
[58] Field of Search .................. 372/41, 68; 385/141; 252/301.17, 301.18, 301.4 P, 301.4 R, 301.4 H, 301.4 F; 359/885; 501/46

[56] References Cited

U.S. PATENT DOCUMENTS

| | | | |
|---|---|---|---|
| 3,501,412 | 3/1970 | Ropp | 252/301.4 R |
| 3,511,785 | 5/1970 | Ropp | 252/301.4 R |
| 3,555,337 | 1/1971 | Faria et al. | 252/301.4 R |
| 3,747,017 | 7/1973 | Varsanyi | 372/41 |
| 4,107,571 | 8/1978 | Tanizumi et al. | 252/301.4 P |
| 4,797,889 | 1/1989 | Lempicki | 372/41 |

FOREIGN PATENT DOCUMENTS

| | | | |
|---|---|---|---|
| 3301289 | 12/1988 | Japan | 252/301.4 P |
| 946073 | 1/1964 | United Kingdom | |
| 1197316 | 7/1967 | United Kingdom | |
| 1215279 | 10/1969 | United Kingdom | |

OTHER PUBLICATIONS

L. H. Brixner, "Crystal Growth and Fluorescent Properties of Rare Earth-Doped Calcium Fluorovanadate", *J. of Solid State Chem. 1*, pp. 185–189, (1970).

L. H. Brixner et al., "Preparation and Properties of Some Strontium-Oxometallates," *J. of Solid State Chem 2*, pp. 55–60, (1970).

*Primary Examiner*—Rodney B. Bovernick
*Assistant Examiner*—Robert McNutt
*Attorney, Agent, or Firm*—Henry P. Sartorio; Roger S. Gaither; William R. Moser

[57] ABSTRACT

$Yb^{3+}$ and $Nd^{3+}$ doped $Sr_5(VO_4)_3F$ crystals serve as useful infrared laser media that exhibit low thresholds of oscillation and high slope efficiencies, and can be grown with high optical quality. These laser media possess unusually high absorption and emission cross sections, which provide the crystals with the ability to generate greater gain for a given amount of pump power. Many related crystals such as $Sr_5(VO_4)_3F$ crystals doped with other rare earths, transition metals, or actinides, as well as the many structural analogs of $Sr_5(VO_4)_3F$, where the $Sr^{2+}$ and $F^-$ ions are replaced by related chemical species, have similar properties.

15 Claims, 4 Drawing Sheets

YTTERBIUM- AND NEODYMIUM-DOPED VANADATE LASER HOSE CRYSTALS HAVING THE APATITE CRYSTAL STRUCTURE

The United States Government has rights in this invention pursuant to Contract No. W-7405-ENG-48 between the United States Department of Energy and the University of California for the operation of Lawrence Livermore National Laboratory.

BACKGROUND OF THE INVENTION

The invention relates most generally to light-transmitting solid-state optical materials, more particularly to metal-ion-doped solid-state laser host crystals, and most particularly to neodymium- and ytterbium-doped vanadate crystals having the apatite structure, such as $Sr_5(VO_4)_3F$.

Solid-state lasers based on rare-earth-doped crystals are rapidly rising in technological significance, and these types of systems are becoming more commonly employed in industrial, medical, scientific, and military applications. The diverse nature of applications, however, require the availability of a wide variety of laser materials whose properties are appropriately matched to each technical scenario. Nd-doped $Y_3Al_5O_{12}$ (Nd:YAG) is the most common laser material, owing to its high emission cross section, relatively long energy storage time, and robust thermomechanical properties. The usual output wavelength for Nd:YAG is 1.064 $\mu$m, and it is pumped either with laser diodes at 0.808 $\mu$m, or with a flashlamp source emitting a broad white light spectrum. In either case, Nd:YAG suffers from some difficulty in permitting an efficient and convenient means of being pumped, as a consequence of the narrow spectral width of its absorption lines.

Many new Nd laser materials have become available during the last decade which offer both advantages and disadvantages with respect to Nd:YAG. For example, Nd-doped $LiYF_4$ (YLF) has wider absorption features and a longer energy storage time compared to Nd:YAG, although YLF is not as mechanically robust. Nd-doped phosphate glass, on the other hand, can be melted in large size at much lower cost, although the cross section is considerably lower than Nd:YAG. The Nd-doped $YAlO_3$ (YALO) crystal exhibits minimal thermal birefringence, but is more difficult to grow. There exist numerous other examples of Nd-doped media that offer some type of trade-off in properties with respect to those of Nd:YAG. In particular, Nd-doped $YVO_4$ possesses a remarkably high emission cross section that is larger than that of Nd:YAG, while nevertheless having a greater absorption linewidth. These two properties of Nd:$YVO_4$ ease both the wavelength and power requirements of the diode pump source, for low power applications. Unfortunately, the $YVO_4$ host is very difficult and expensive to grow as a single crystal, even in small sizes (<1 cm).

Solid-state laser media can be based on many other laser ions in addition to Nd, and these alternative ions can be characterized by significantly different optical properties. For example, Yb lasers must be diode-pumped at longer wavelengths than Nd lasers, thereby requiring the use of InGaAs laser diodes (rather than AlGaAs as for Nd). Yb lasers are furthermore generally characterized by a reduced quantum defect between the pump and laser wavelengths, thereby leading to a reduction in the amount of heat deposited into the gain medium by the pump source.

British Patent Specification 1,215,279 describes single-phase solid solutions of a host crystal, calcium fluorovanadate, $Ca_5(VO_4)_3F$, in which a portion of the calcium has been substituted by a rare earth ion, and electroneutrality restored by the introduction of sodium ion or by substitution of oxygen ion for a portion of the fluorine. The compositions are useful in the polycrystalline powdered state as phosphors and in the single crystal state as laser crystals. The laser crystals are pumped by sources such as mercury vapor or xenon lamps.

L. H. Brixner, "Crystal Growth and Fluorescent Properties of Rare Earth-Doped Calcium Fluorovandate," *J. Solid State Chem.* 1, pp. 185–189, (1970), describes the growth of large single crystals with the apatite structure by the Czochralski method. The crystals are doped with various rare earths, with charge compensation using sodium or oxygen ions. The use as laser crystals is suggested.

L. H. Brixner et al., "Preparation and Properties of Some Strontium-Oxometallates," *J. Solid State Chem.* 2, pp. 55–60, (1970), describes the formation of a number of ternary strontium oxides by the flux reaction method.

British Patent Specification 946,073 describes halovanadates of the formula $XMO-V_2O_5-YMH_2$ where M=Zn, Cd, Mg, Sr, or Ba, H=Cl or F, X is a number from 1 to 6, Y is a number from 0.5 to 1.0. These materials are luminescent materials useful in fluorescent electric discharge lamps.

British patent specification 1,197,316 describes a fluoroapatite (FAP) crystal, calcium fluorophosphate, $Ca_5(PO_4)_3F$ with rare earth dopants, where the Ca may be substituted by Ba, Sr, or Mg and charge compensation for the rare earth dopant may be with an alkali metal or oxygen ions. The material is useful as a laser crystal which can be pumped by a flashlamp.

U.S. patent application Ser. No. 07/792,792 U.S. Pat. No. 5,280,492) filed Nov. 15, 1991, entitled "Yb:FAP and Related Materials, Laser Gain Medium Comprising Same, and Laser Systems Using Same," expands the fluorophosphate crystal with apatite structure to $M_5(PO_4)_3X$ where M is Ca, Sr, Cd, Pb or a combination of monovalent and trivalent ions Li, Na, K or Rb, and Y, La, Gd, Lu or other rare earth and X is F, Cl, Br, I, OH, O or S. The Yb doped crystal is useful as a laser gain material and can be pumped with laser diodes at 0.905 or 0.98 microns.

SUMMARY OF THE INVENTION

Accordingly, it is an object of the invention to provide light-transmitting optical materials in single-crystal form.

It is another object of the invention to provide a single-crystal host material that may be doped with metal ions.

It is also an object of the invention to provide a solid-state laser gain medium, comprising vanadate crystals having the apatite structure, that are doped with metal ions.

It is a further object of the invention to provide an ytterbium- or neodymium-doped solid-state fluorovanadate laser crystal that exhibits superior laser properties.

The invention comprises rare-earth-doped fluorovanadate single crystals, including Yb:$Sr_5(VO_4)_3F$ and Nd:$Sr_5(VO_4)_3F$. These particular laser materials have been demonstrated to operate efficiently. Nd:$Sr_5(VO_4)_3F$ is also characterized by a large emission cross section, and can be grown in large size with high optical quality. Nd:Sr$_5$(VO$_4$)$_3$F may therefore serve as a superior replacement for the existing state-of-the-art high cross section Nd laser materials. Yb-doped Sr$_5$(VO$_4$)$_3$F possesses excellent laser properties, in terms of having high absorption and emission cross sections, and an absorption band linewidth that is suitable for diode pumping. The host material Sr$_5$(VO$_4$)$_3$F is a member of a larger class of vanadate crystals that possesses the apatite crystalline structure. This class of crystal hosts can be doped with a wide variety of metal ions that serve usefully as laser centers. The invention includes the growth of large single crystals of Sr$_5$(VO$_4$)$_3$F, up to or exceeding 1 cm$^3$ in size, by the Czochralski crystal growth method. Other related crystals and other growth methods may also be used. The related crystals include the composition M$_5$(VO$_4$)$_3$X wherein M is at least one divalent cation selected from Sr$^{2+}$, Mg$^{2+}$, Ba$^{2+}$, Cd$^{2+}$, or Pb$^{2+}$, or at least one combination of monovalent and trivalent ions selected from Li$^+$, Na$^+$, K$^+$, Rb$^+$, with Sc$^{3+}$, Y$^{3+}$, La$^{3+}$, Gd$^{3+}$, Lu$^{3+}$, or other RE$^{3+}$, (rare earth), and X is at least one singly-charged anion selected from F$^-$, Cl$^-$, Br$^-$, I$^-$, OH$^-$, or one-half the fraction of a doubly-charge anion selected from O$^{2-}$, S$^{2-}$. Suitable dopants include rare earth ions, transition metal ions, and actinide ions.

DETAILED DESCRIPTION OF THE INVENTION

The invention is a solid state laser material comprising neodymium or ytterbium doped strontium fluorovanadate, Nd:Sr$_5$(VO$_4$)$_3$F, or Yb:Sr$_5$(VO$_4$)$_3$F, respectively, and a laser formed from the rare earth doped fluorovanadate laser material host. The Nd:Sr$_5$(VO$_4$)$_3$F laser material can be pumped by flashlamps, laser diodes, or other sources, has a high slope efficiency compared to other Nd lasers, and generates light at 1065 nm. The Yb:Sr$_5$(VO$_4$)$_3$F laser can be pumped by laser diodes or other narrow-band sources, exhibits a high slope efficiency compared to other Yb lasers, and generates light at 1044 nm.

The Sr$_5$(VO$_4$)$_3$F crystal is synthetically grown as a large single crystal by utilizing known techniques such as the Czochralski method. The rare earth dopant concentration in the crystal is about 1 atomic %, and more generally about 0.1–10 atomic %. Crystals having 3 cm diameter and 10 cm length have been formed, and can be made even larger. Sr$_5$(VO$_4$)$_3$F is made by first mixing the appropriate proportions of SrO and V$_2$O$_5$ (approximately 8:3 ratio) along with the intended rare earth oxide dopants, and then fusing these starting materials by melting. Two parts of SrF$_2$ are then added, and the entire mixture is placed in a crucible and held at the melting point of 1650° C. A seed is dipped into the melt, as prescribed by the Czochralski technique, and then rotated at the rate of about 10 revolutions per minute while being slowly raised at the rate of about 1 mm/hr. A crystalline boule thereby slowly emerges from the melt, and most of the boule is found to consist of clear single crystal material, with minimal cracks, smoke, or other forms of optical obscuration.

Figure 1A:
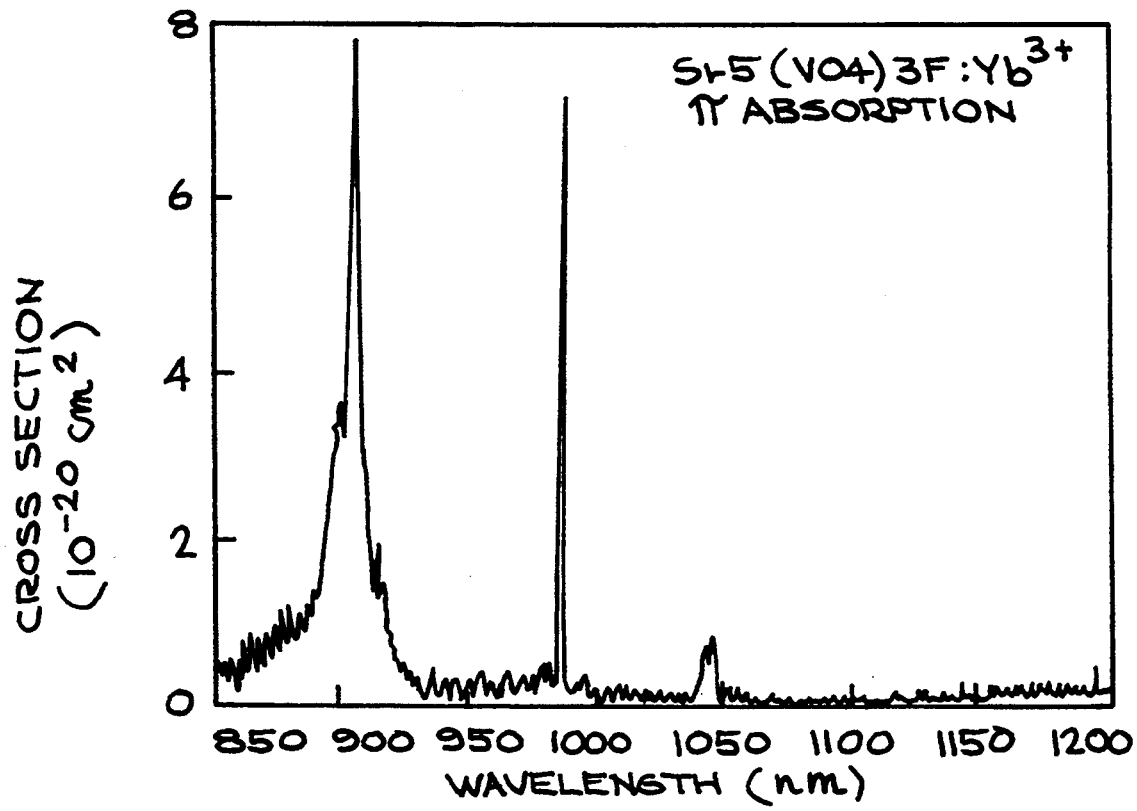
FIG. 1A, B shows the absorption and emission spectra of Yb:Sr$_5$(VO$_4$)$_3$F, respectively, for the electric field of the light being polarized parallel to the c axis of the crystal.

Spectroscopic measurements at room temperature of Yb in Sr$_5$(VO$_4$)$_3$F are shown in FIGS. 1A, B. The absorption spectrum of FIG. 1A is similar to that of a related fluorophosphate crystal, Yb-doped Sr$_5$(PO$_4$)$_3$F, which has previously been demonstrated to exhibit excellent laser performance. On the basis of the absorption spectra, the Yb ions are most suitably pumped at 905 nm, at the peak of the observed feature. Since the ordinate of FIG. 1A involves an absolute cross section scale, the observed cross section at 905 nm of $7.2 \times 10^{-20}$ cm$^2$ represents an exceptionally high value. A high peak cross section is an important attribute for quasi-four-level gain media, such as Yb lasers, to possess since it suggests that the laser will exhibit a low pump threshold. The feature near 986 nm could also potentially be employed as the pump band, although a less convenient pumping scheme would be required since the line is so spectrally narrow.

The observation of a single sharp line at 986 nm also indicates that only a single type of Yb$^{3+}$ ion exists in the Sr$_5$(VO$_4$)$_3$F crystal lattice. In analogy to the fluorophosphate crystal having the same apatite crystal structure as Sr$_5$(VO$_4$)$_3$F, it is concluded that the laser center involves the substitution of a Sr$^{2+}$ host metal ion located in the II-site of the crystal, by an Yb$^{3+}$ ion, and the additional replacement of the neighboring F$^-$ ion by an O$^{2-}$ ion. In other words, in order to maintain charge neutrality, a Sr$^{2+}{}_{II}$—F$^-$ pair is replaced with an Yb$^{3+}$—O$^{2-}$ pair.

Figure 1B:
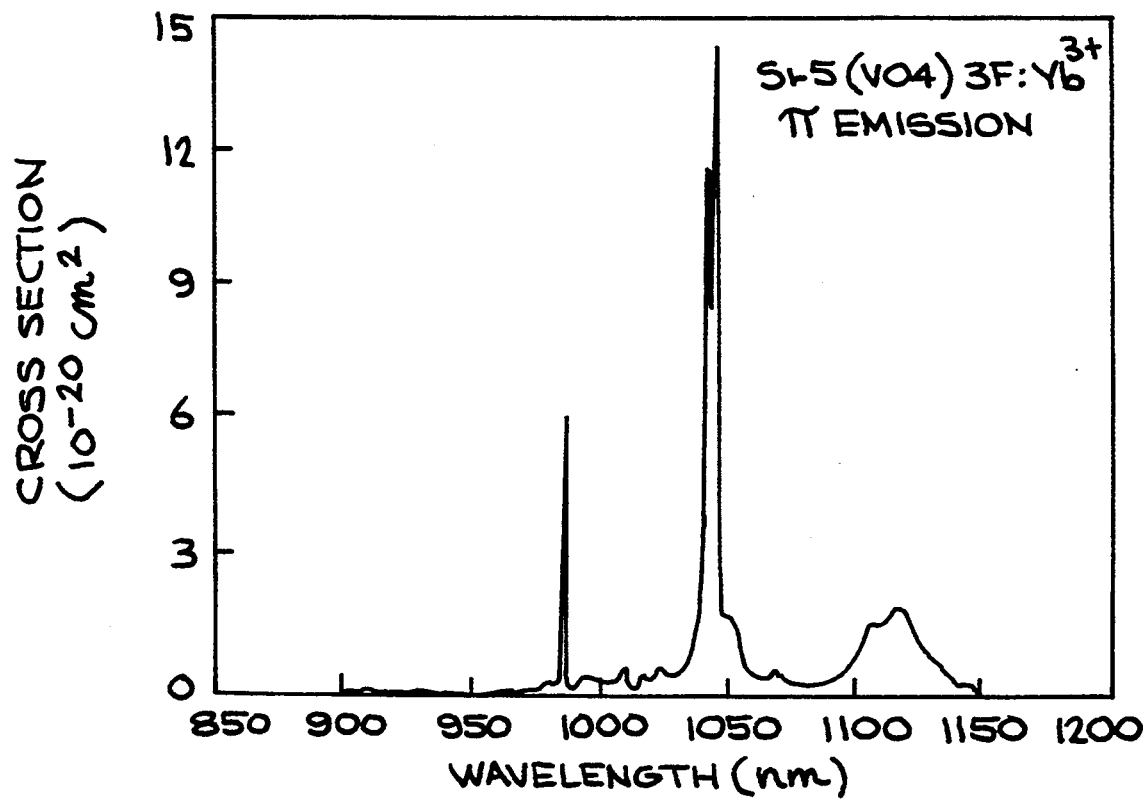

The emission spectrum of Yb:Sr$_5$(VO$_4$)$_3$F in FIG. 1B is also remarkable, in that the observed emission line at 1044 nm exhibits the highest cross section observed to date for any Yb-doped crystal or glass. The high emission cross section suggests that, under the appropriate conditions, this crystal should lase with a low threshold in an oscillator configuration, and have high gain in an amplifier system.

It is equally important that, at room temperature, the emission cross section at 1044 nm is $13.1 \times 10^{-20}$ cm$^2$, while the absorption cross section at this same wavelength is only $0.9 \times 10^{-20}$ cm$^2$. The low absorption values at the laser wavelength suggest that Yb:Sr$_5$(VO$_4$)$_3$F will serve as a useful quasi-four-level system since, according to basic laser theory, $0.9/(0.9+13.1)=0.06$ of the Yb ions will need to be inverted in order to have net gain at 1044 nm. This requirement is relatively modest and can easily be accomplished with existing laser diodes or other lasers that operate at 905 nm.

Two additional aspects of the emission properties of Yb in Sr$_5$(VO$_4$)$_3$F are significant. Firstly, on the basis of the spectrum of FIG. 1B, the Yb ions can also be expected to lase at the auxiliary emission peak near 1120 nm, although the low cross section characteristic of this feature will probably require more input pump power in order to have adequate gain. Secondly, the emission lifetime of Yb in Sr$_5$(VO$_4$)$_3$F was measured to be 0.59 msec, which is of adequate length to store pump energy, prior to Q-switching in an oscillator, or extracting energy in an amplifying mode.

Figure 2A:
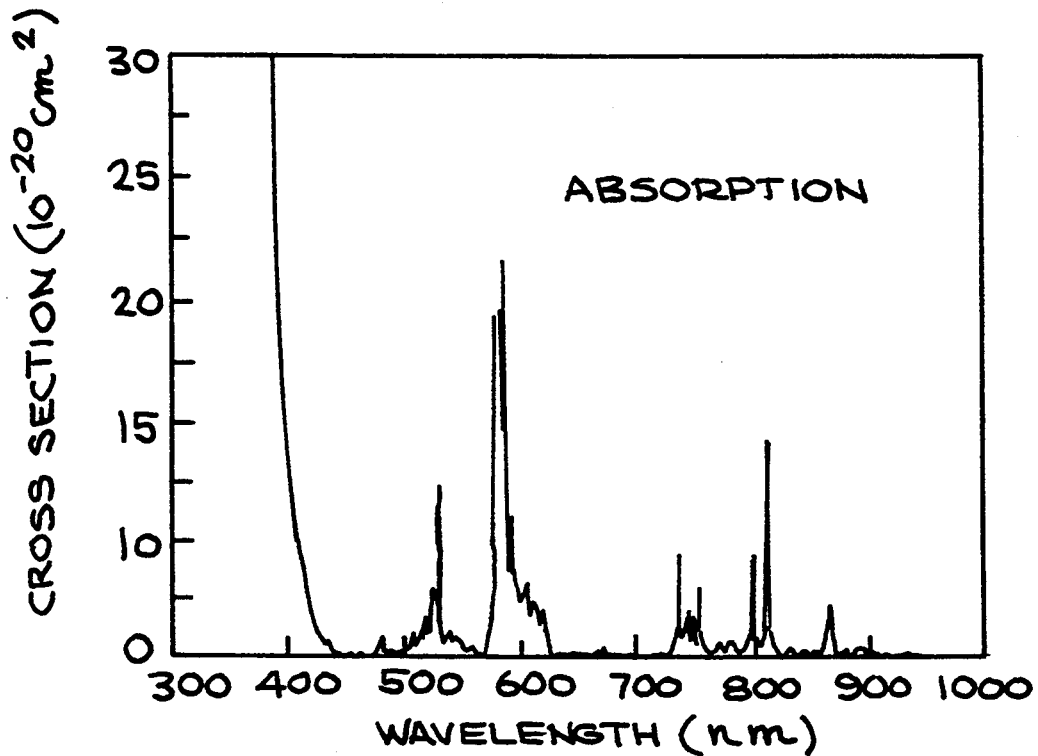
FIG. 2A, B shows the absorption and emission spectra of Nd:Sr$_5$(VO$_4$)$_3$F, respectively, for the electric field of the light being polarized parallel to the c axis of the crystal.

Other rare earth ions, in addition to $Yb^{3+}$, were also found to have useful properties in the $Sr_5(VO_4)_3F$ crystal. As an example of another useful rare-earth-doped crystal, the absorption and emission spectra of $Nd^{3+}$ in $Sr_5(VO_4)_3F$ are shown in FIGS. 2A, B. The absorption spectrum in FIG. 2A reveals that $Nd^{3+}$ exhibits many more absorption lines than does $Yb^{3+}$, all of which in principle may serve as pump bands by which to introduce energy into the laser crystal in order to generate laser action. For example, if an AlGaAs laser diode were to be employed to pump this crystal, it would be preferable to operate the diode near 809 nm. It is nevertheless useful to pump $Nd:Sr_5(VO_4)_3F$ at other wavelengths such as 798 nm, or in the ranges of 500–540 nm, 500–620 nm, 720–760 nm, 790–840 nm, or 850–890 nm. Alternatively, a pump source that emits a broad spectral output, rather than a single line, may be employed. For example, a flashlamp may be used to pump one or more of the spectral features apparent in FIG. 2A.

Figure 2B:
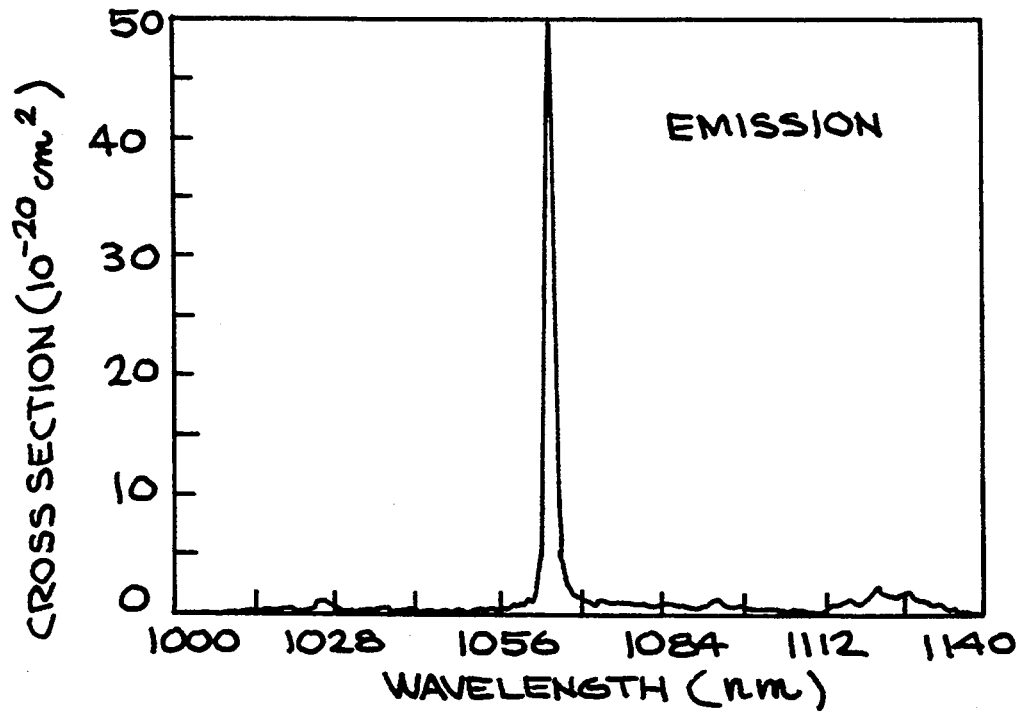

The emission spectrum of $Nd:Sr_5(VO_4)_3F$ is shown in FIG. 2B. The shape of this spectrum is truly remarkable, in that only a single sharp emission line is exhibited by the crystal. Since nearly all other Nd-doped crystals tend to exhibit numerous lines and bands in the emission spectrum, the $Nd:Sr_5(VO_4)_3F$ spectrum is unique in that all of the transition strength becomes concentrated into a single feature, thereby yielding an exceptionally large emission cross section. On the basis of this large cross section, and additionally the relatively long emission lifetime of 230 μsec, a $Nd:Sr_5(VO_4)_3F$ laser may be expected to have a very low threshold of oscillation.

As a consequence of the high emission cross section, adequate emission lifetime, and excellent optical quality exhibited by the $Nd:Sr_5(VO_4)_3F$ crystal, this material may serve usefully in miniature, low-power laser diode-pumped oscillators, in which it is desirable to expend the minimum amount of pump energy in order to reach the threshold of laser oscillation. The current state-of-the-art in low threshold Nd lasers is Nd-doped $YVO_4$. Although this crystal, in principle, is expected to have similar threshold characteristics on the basis of its emission properties, the $YVO_4$ crystal cannot be conveniently grown by conventional methods. $YVO_4$ is generally grown by a flux-based technique, which is often both complicated and unreliable. $Sr_5(VO_4)_3F$, on the other hand, can be effectively grown by the well-established Czochralski technique.

Figure 3A:
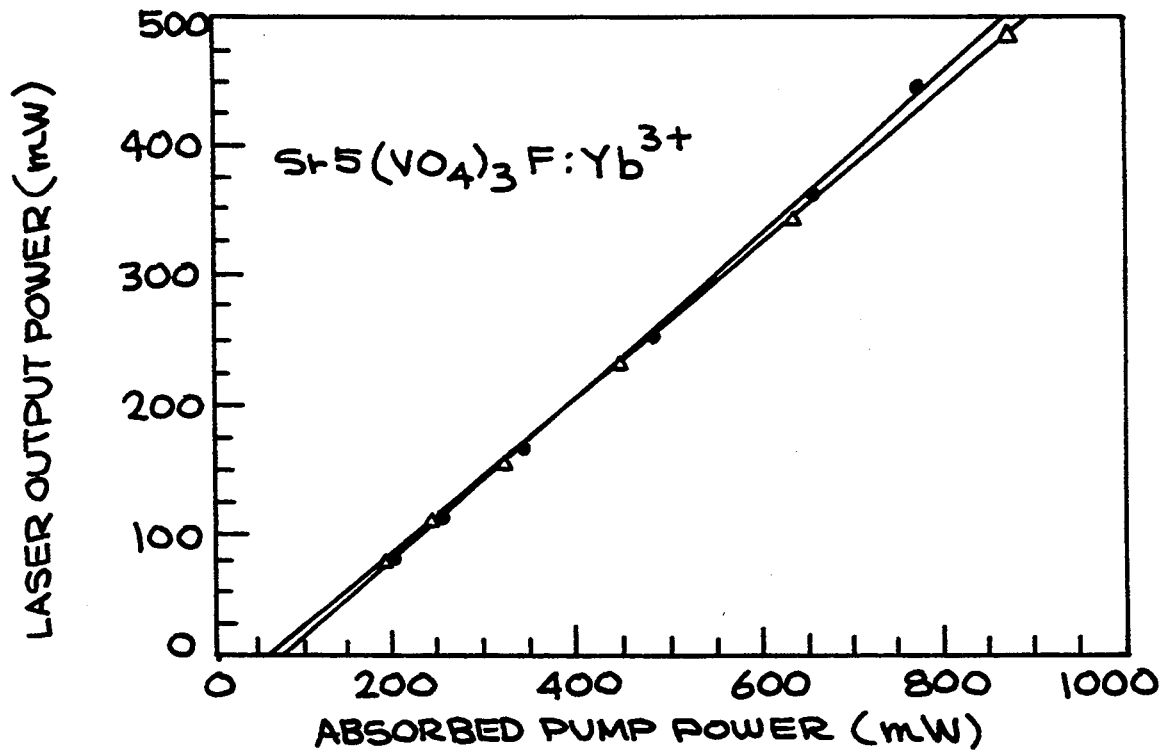
FIG. 3A, B are plots of the output power obtained for Yb:Sr$_5$(VO$_4$)$_3$F and Nd:Sr$_5$(VO$_4$)$_3$F laser crystals, respectively, versus the absorbed input power provided by a Ti:Sapphire laser source longitudinally pumping the crystal located in an oscillator.
Figure 3B:
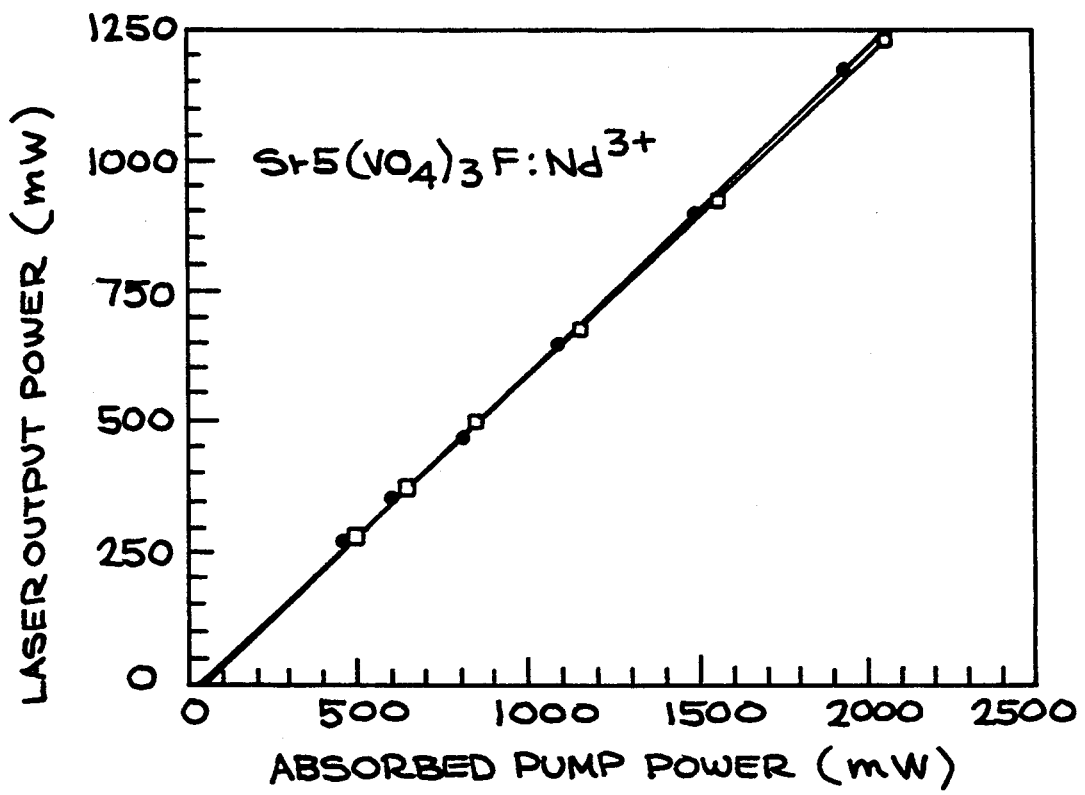

FIGS. 3A, B display examples of plots of the laser oscillation output power, versus the pump power absorbed by the crystal, for $Yb:Sr_5(VO_4)_3F$ and for $Nd:Sr_5(VO_4)_3F$, respectively. A Ti:Sapphire laser was employed to pump the crystals at the appropriate wavelengths of 905 nm for the Yb laser, and 808 nm for the Nd laser. The output coupling of both oscillators was 16%. The slope efficiencies are consistently in the range of 60–62%, while the observed $Nd:Sr_5(VO_4)_3F$ threshold of 30–40 mW was a little lower than that of the $Yb:Sr_5(VO_4)_3F$ laser, 60–75 mW. The data in FIGS. 3A, B prove that both Yb and Nd dopants in the $Sr_5(VO_4)_3F$ crystal host exhibit excellent laser performance, as evidenced by the high slope efficiencies that were measured.

The $Sr_5(VO_4)_3F$ crystal host is useful as a laser material. A significant amount of flexibility is provided, in addition, in that related crystals can be fabricated by substituting divalent cations such as $Mg^{2+}$, $Ba^{2+}$, $Cd^{2+}$, $Pb^{2+}$ for the $Sr^{2+}$ ion, and by substituting combinations of monovalent and trivalent ions such as $Li^+$, $Na^+$, $K^+$, $Rb^+$ with $Sc^{3+}$, $Y^{3+}$, $La^{3+}$, $Gd^{3+}$, $Lu^{3+}$, or other $RE^{3+}$ (rare earth) for the $Sr^{2+}$ ion. Similarly, it is possible to substitute singly-charged anions such as $Cl^-$, $Br^-$, $I^-$, $OH^-$ for $F^-$, and one-half the number of doubly-charged anions such as $O^{2-}$, $S^{2-}$ for $F^-$ ions in the crystal, as well. Furthermore, many metal ion dopants can potentially be incorporated into these host crystals, including all of the rare earth ions, such as Ce, Pr, Nd, Pm, Sm, Eu, Gd, Tb, Dy, Ho, Er, Tm, Yb, and transition metal ions, such as Ti, V, Cr, Mn, Fe, Co, Ni, Cu, Mo, Rh, Pd, Ir, Pt, and actinide ions such as U.

The vanadate material $M_5(VO_4)_3X$ can also be combined with the analogous phosphate material $M_5(PO_4)_3X$ described in U.S. patent application Ser. No. 07/792,792, (U.S. Pat. No. 5,280,492), filed Nov. 15, 1991, which is herein incorporated by reference, to form a mixed crystal, $M_5(VO_4)y(PO_4)_{3-y}X$ where $0 < y \leq 3$. In the mixed crystal, the vanadate ion is partially substituted with phosphate ion.

Figure 4:
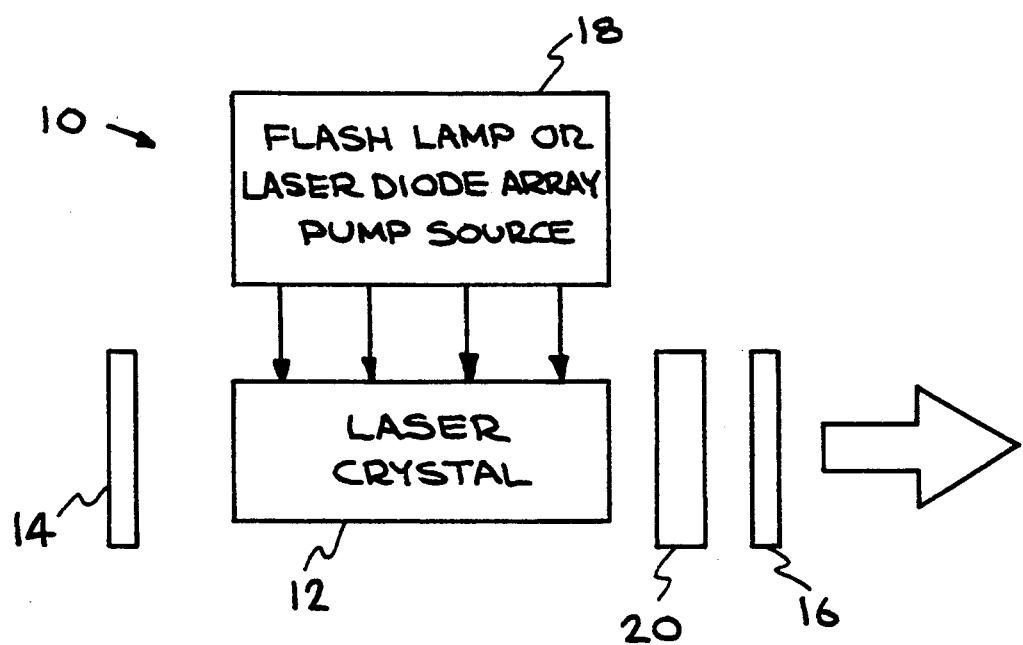
FIG. 4 is a schematic diagram of a Yb:Sr$_5$(VO$_4$)$_3$F or Nd:Sr$_5$(VO$_4$)$_3$F laser.

A schematic diagram of a rare-earth-doped $Sr_5(VO_4)_3F$ laser according to the invention is shown in FIG. 4. Laser 10 is formed of a rare earth doped $Sr_5(VO_4)_3F$ crystal 12, placed between a pair of aligned mirrors 14, 16 or other means of forming a cavity. Excitation means such as a laser diode array or flashlamp 18 are placed in proximity to crystal 12 to pump the laser crystal. Mirror 16 is partially transmitting to the laser wavelength to provide the output coupling or energy extraction means, while mirror 14 is highly reflecting. Additional optical elements such as a tuning element or Q-switch 20 may also be placed in the resonant cavity to control the wavelength or pulse format of the laser output. The additional element could also be a modelocker, Pockels cell, or etalon.

It is also possible to utilize the fluorovanadate crystal, in doped or undoped form, in an application where the material is utilized to transmit light. Examples of these types of applications include optical windows, prisms, color filters, electro-optic elements, lenses, and nonlinear optical components. In these applications, doping may be required to selectively transmit certain wavelengths of light, or to otherwise influence the properties of the light transmitted by the optical material.

Changes and modifications in the specifically described embodiments can be carried out without departure from the scope of the invention which is intended to be limited only by the scope of the appended claims.

We claim:

1. A solid-state laser gain medium, comprising:
   a crystal of the composition $M_5(VO_4)_3X$, wherein M is at least one divalent cation selected from $Sr^{2+}$, $Mg^{2+}$, $Ba^{2+}$, $Cd^{2+}$, or $Pb^{2+}$, or at least one combination of monovalent and trivalent ions, selected from $Li^+$, $Na^+$, $K^+$, $Rb^+$, with $Sc^{3+}$, $Y^{3+}$, $La^{3+}$, $Gd^{3+}$, $Lu^{3+}$, or other $RE^{3+}$ (rare earth), and X is at least one singly-charged anion selected from $F^-$, $Cl^-$, $Br^-$, $I^-$, $OH^-$, or one-half the fraction of a doubly-charge anion selected from $O^{2-}$, $S^{2-}$;
   one or more dopants included in the crystal, selected from rare earth ions, transition metal ions and actinide ions.

2. The optical material of claim 1, wherein the rare earth ions are selected from Ce, Pr, Nd, Pm, Sm, Eu, Gd, Tb, Dy, Ho, Er, Tm, Yb, the transition metal ions are selected from Ti, V, Cr, Mn, Fe, Co, Ni, Cu, Rh, Mo, Pd, Ir, Pt, and the actinide ion is U.

3. The solid-state laser gain medium of claim 1, comprising a $Sr_5(VO_4)_3F$ crystal.

4. The solid-state laser gain medium of claim 1, comprising a Nd-doped $Sr_5(VO_4)_3F$ crystal.

5. The solid-state laser gain medium of claim 1, comprising an Yb-doped $Sr_5(VO_4)_3F$ crystal.

6. The solid-state laser gain medium of claim 1, further comprising excitation means associated with the crystal for pumping the crystal.

7. The solid-state laser gain medium of claim 6, wherein the excitation means is a flashlamp, laser diode, or other laser source.

8. The solid-state laser gain medium of claim 6, further comprising cavity forming means surrounding the crystal to form a resonant laser cavity.

9. The solid-state laser gain medium of claim 8, further comprising a means of extracting energy from the cavity.

10. The solid-state laser gain medium of claim 8, further comprising an additional optical component selected from a wavelength tuning element, Q-switch, mode-locker, Pockels cell, or etalon placed in the cavity.

11. The solid-state laser gain medium of claim 1, wherein the vanadate ion is partially substituted with phosphate ions.

12. A solid state laser, comprising:
a solid state laser gain medium, comprising:
a crystal of the composition $MS_5(VO_4)_3X$, wherein M is at least one divalent cation selected from $Sr^{2+}$, $Mg^{2+}$, $Ba^{2+}$, $Cd^{2+}$, or $Pb^{2+}$, or at least one combination of monovalent and trivalent ions, selected from $Li^+$, $Na^+$, $K^+$, $Rb^+$, with $Sc^{3+}$, $Y^{3+}$, $La^{3+}$, $Gd^{3+}$, $Lu^{3+}$, or other $RE^{3+}$ (rare earth), and X is at least one singly-charged anion selected from $F^-$, $Cl^-$, $Br^-$, $I^-$, $OH^-$, or one-half the fraction of a doubly-charge anion selected from $O^{2-}$, $S^{2-}$;

one or more dopants included in the crystal, selected from rare earth ions, transition metal ions and actinide ions;

excitation means associated with the gain medium for pumping the gain medium;

cavity forming means surrounding the gain medium to form a resonant laser cavity;

energy extraction means associated with the cavity forming means to remove laser energy from the cavity.

13. The solid state laser of claim 12, wherein the gain medium is $Yb:Sr_5(VO_4)_3F$.

14. The solid state laser of claim 12, wherein the gain medium is $Nd:Sr_5(VO_4)_3F$.

15. The solid state laser of claim 12, wherein the excitation means is a laser diode.

* * * * *